US006931332B2

(12) United States Patent
Phansalkar et al.

(10) Patent No.: US 6,931,332 B2
(45) Date of Patent: Aug. 16, 2005

(54) METHOD AND SYSTEM FOR TESTING BATTERY CONNECTIVITY

(75) Inventors: Bansidhar Jagannath Phansalkar, B'lore (IN); Pradeep Nagabhushan Rao Tolakanahalli, B'lore (IN); Sunit Kumar Saxena, Uttlar Pradesh (IN)

(73) Assignee: General Electric Company, Niskayuna, NY (US)

( * ) Notice: Subject to any disclaimer, the term of this patent is extended or adjusted under 35 U.S.C. 154(b) by 49 days.

(21) Appl. No.: 10/677,808

(22) Filed: Oct. 1, 2003

(65) Prior Publication Data

US 2005/0075806 A1 Apr. 7, 2005

(51) Int. Cl.[7] ............................. G06F 19/00; H02J 7/00
(52) U.S. Cl. .................... 702/63; 324/426; 324/427; 324/430; 324/434; 320/124; 320/137; 320/132; 320/134
(58) Field of Search ........................... 702/63; 324/426, 324/427, 430, 434; 320/116, 124, 137, 126, 132, 134, 136

(56) References Cited

U.S. PATENT DOCUMENTS

| | | | | |
|---|---|---|---|---|
| 4,433,294 A | * | 2/1984 | Windebank | ................. 324/426 |
| 4,968,943 A | | 11/1990 | Russo et al. | |
| 5,969,625 A | | 10/1999 | Russo et al. | |
| 6,118,275 A | * | 9/2000 | Yoon et al. | ................. 324/427 |
| 6,167,349 A | * | 12/2000 | Alvarez | ....................... 702/63 |
| 6,384,576 B1 | | 5/2002 | Jokinen et al. | |
| 6,388,423 B1 | | 5/2002 | Schilleci, Jr. et al. | |
| 6,583,603 B1 | * | 6/2003 | Baldwin | ..................... 320/121 |
| 6,677,759 B2 | * | 1/2004 | Friel et al. | .................. 324/430 |
| 6,747,456 B2 | * | 6/2004 | Scott | .......................... 324/426 |
| 2001/0033169 A1 | * | 10/2001 | Singh et al. | ................. 324/426 |
| 2002/0084771 A1 | * | 7/2002 | Lundberg | ................... 320/134 |
| 2004/0095143 A1 | * | 5/2004 | Laig-Hoerstebrock et al. | ... 324/426 |
| 2004/0130297 A1 | * | 7/2004 | Baeuerlein et al. | ......... 320/137 |

FOREIGN PATENT DOCUMENTS

WO    WO 01/73914 A2    10/2001

OTHER PUBLICATIONS

Waltari et al., "Survey and Evaluation of Battery Monitoring Methods and Results from User's Viewpoint", IEEE, 1999.*

Plow et al., "Float Current Monitoring and Evaluation", IEEE, 2000.*

Taniguchi et al., "A Method for Identifying the Full Charging Point and the Degree of Deterioration of Lead–Acid Batteries", IEEE, 2000.*

* cited by examiner

*Primary Examiner*—Patrick J. Assouad
(74) *Attorney, Agent, or Firm*—Jason K. Klindtworth; Jean K. Testa (57) ABSTRACT

A method for testing battery connectivity in a battery-backed up system, the method includes inducing a step increase in a battery bus voltage, and monitoring a magnitude of a corresponding current pulse of a battery charge due to the step increase in the battery bus voltage, where the magnitude of the current pulse provides an indicator of battery connectivity.

19 Claims, 8 Drawing Sheets

METHOD AND SYSTEM FOR TESTING BATTERY CONNECTIVITY

BACKGROUND OF THE INVENTION

The invention relates generally to battery backed-up power supply systems and more specifically to methods and systems for testing battery connectivity in such battery backed-up systems.

Reliable and quality power is essential for smooth functioning of industrial and non-industrial systems like hospitals, utilities, telecommunication systems, airlines, railways, operations in manufacturing sites and several other operations. Besides the failure of supply of power, even the voltage sags and spikes in the power supply affect the quality of power and these may have detrimental effect on the systems or equipments being supported by such a power supply.

Power management systems such as the uninterruptible power supply (UPS) systems typically allow the main utility power either directly or through converters, to supply the connected load during periods of availability of high quality generated electric power. However, when there is power loss or power is of poor quality, these systems switch to an alternate source of electric power to generate the required output for the connected loads.

Typically, the alternate source is in the form of batteries. Even in systems that utilize a motor-driven electric power generator, batteries are used to bridge the gap between the loss of utility power and the availability of the motor-driven generator. Availability of the battery back-up during power breakdown, including when the quality of power is poor, is very critical for normal functioning of any system. Typically, the electric power storage batteries include a number of individual battery cells coupled in series to generate the output voltage required for the system. Since each of the individual battery cells are required to generate the proper output voltage, the presence of an undetected failed cell may result in a system malfunction during periods of power outage when the batteries are used to supply power to the connected load. Alternatively the duration and quality of power supplied by the batteries may not be sufficient to drive the load appropriately. Hence reliability of these critical systems depends on the health and connectivity or presence of the battery bank, at all times. Additionally, the connectivity or presence of battery bank should be monitored frequently, to ensure that there is no open circuit in the path of energy storage for reasons like circuit breaker open, loose connection or open cell etc.

Generally, the techniques used for monitoring the state of batteries or for testing the battery connectivity typically involve discharging the battery. This discharging in turn affects the life of the battery. Typically, normal maintenance is carried out 2–4 times a year and cell voltages and specific gravities are measured in float charging conditions. A load test is also performed once every 1–3 years. Additionally, the connections and internal corrosion of a battery are measured by impedance and conductance measurements. In one such technique, 70–80% of the battery capacity is discharged and a voltage deviation between a fixed reference voltage and a middle-point voltage of the battery string is measured. Another technique monitors a resistance component of the battery bank by monitoring the relationship between a voltage drop across the entire battery bank, based on audio frequency injected current. In another technique, the state of charge is measured by using a separate power supply. In this technique, the measurement affects the total battery voltage and the load voltage.

The monitoring techniques involving discharge of the batteries have the disadvantage that in the event of any power failure occurring during or within a period of several hours after the monitoring, the batteries may not be able to supply the back-up power since the batteries may not be fully recharged in this interim period. Further, these techniques cannot be employed frequently and therefore the reliability of the power supply always remains uncertain.

It would therefore be desirable to have a simple and no-discharge method to assure the connectivity or presence of the battery bank to the power management systems.

BRIEF SUMMARY OF THE INVENTION

Briefly, in accordance with a first aspect of the invention, a battery-backed up system is provided and the system includes at least one battery to supply power to the system for maintaining a steady output, at least one converter for charging the battery, and a controller for detecting the battery connectivity. The controller is configured for providing a step increase in a battery bus voltage and for monitoring a magnitude of a corresponding current pulse of a battery charge.

In accordance with a second aspect of the invention, a method for testing battery connectivity in a battery-backed up system is provided, and the method includes inducing a step increase in a battery bus voltage, and monitoring a magnitude of a corresponding current pulse of a battery charge due to the step increase in the battery bus voltage, where the magnitude of the current pulse provides an indicator of battery connectivity.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
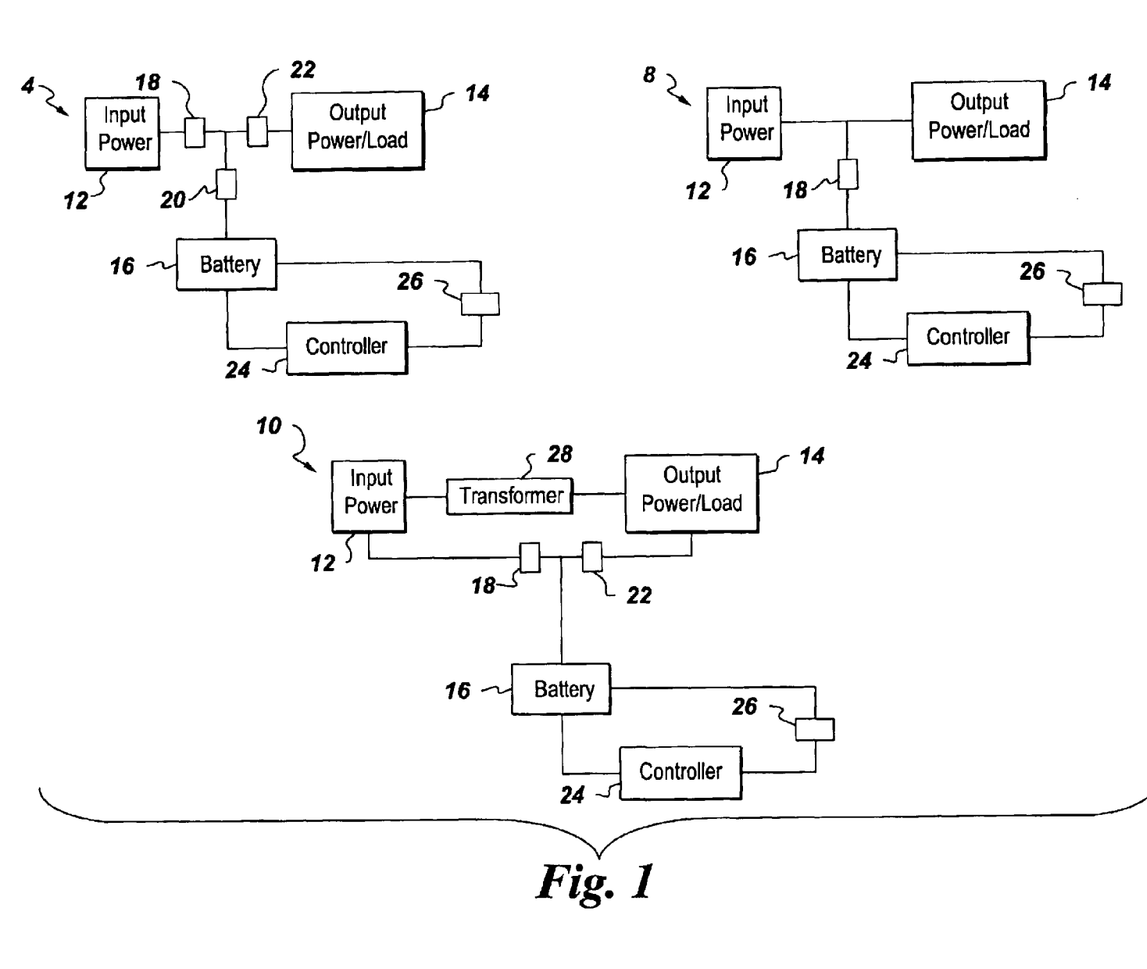
FIG. 1 is a schematic block diagram of exemplary battery backed-up systems suitable for use with the present invention.

FIG. 1 is a diagrammatic schematic of typical battery backed-up systems illustrated as systems 4, 8 and 10. These systems are powered by an input power supply via an input power source 12. As would be appreciated by those skilled in the art, source 12 could be an electric power source, or alternatively any other power source including but not limited to photovoltaic, fuel cells, alternate energy source for example wind or any other similar source providing input power supply to the systems 4, 8 and 10. These systems generate an output 14 or drive a load (not shown), the output could be electrical (AC or DC) or even mechanical output. The systems 4, 8, 10 are backed-up by at least one battery 16 to supply power to the system for maintaining a steady output. The battery 16 comes in operation when the input power supply from the source 12 is inadequate. Power may be considered inadequate due a number of reasons, for example, unavailability of the input power supply for certain time intervals, or the input power supply may be unable to meet output power demand due to a variation or discontinuity of input power supply at the source 12. In one example, a plurality of batteries connected in series are provided as a back-up power source for these systems. The battery 16 is charged during normal operation by at least one converter 18. In one embodiment, a plurality of converters are included, where at least one converter 18 is coupled to the source 12. Alternatively, the converter 18 can be coupled to any independent input power source such as an auxiliary source (not shown). The converter 18, as would be appreciated by those skilled in the art is AC/DC or DC/DC depending on whether the input power supply is AC or DC respectively.

In one example illustrated via system 4 in FIG. 1, an optional converter 20 is provided coupled to converter 18, and at least one converter 22 is coupled to the output 14 of the system 10. This is a case of a typical double conversion UPS system. The converter 20 is DC/DC and is provided to condition the output from converter 18 and converter 22 is DC/AC or DC/DC depending on the load requirement at the output 14. During normal operation, converter 18 (working in a rectifier mode) converts the input supply to regulated DC, which is used to supply power to the converter 18, in order to charge the battery 16, as well as to supply the converter 22 (which operates in an inverter mode, in system 4). The converter 22 converts the DC to a voltage & frequency regulated AC output at all times to drive a connected load at the output 14. During a stored energy mode such as during a failure of input supply, the converter 22 draws power from the battery 18 and continues to supply the output 14.

In another example, illustrated by system 8, where the input power supply at source 12 is not conditioned, i.e the DC/DC voltage levels at the source 12 and at converter 18 are different, a switch (not shown) may be used. A switch may also be used to change the input power supply from source 12 to battery 16 in case of power failure. Alternatively, auto switching may be provided in the control system (not shown) for system 8. As would be appreciated by those skilled in the art, a switch may also be incorporated similarly in system 4 and system 10.

In another specific example, illustrated by system 10 of FIG. 1, a transformer 28 is additionally provided to condition the input power supply from the source 12. As would be appreciated by those skilled in the art, the examples of battery backed-up systems in FIG. 1 are merely illustrative and several other configurations of these systems are possible.

Referring to FIG. 1, in systems 4, 8, and 10, a controller 24 is provided in these systems to detect the battery connectivity according to techniques described herein below. In a specific embodiment, the controller 24 is configured to provide a step increase in a battery bus voltage and to monitor a magnitude of a corresponding current pulse of a battery charge due the step increase in the battery bus voltage. The amplitude and shape of the current pulse is battery dependent and is an indicator of both battery connectivity and state of battery degradation, alternatively referred to as battery health. In a specific example, additional printed circuit boards (PCBs) are provided to change the reference voltage levels and to read-out the corresponding magnitude of the current pulse inside the controller's circuitry. Alternately, a current sensor 26 is additionally provided such as a Hall effect sensor or shunt or DC current sensor to sense and/or measure the magnitude of the current pulse due to the step increase in the battery bus voltage. As would be appreciated by those skilled in the art any other means to measure a current pulse at converter-controller interface may be employed. In these embodiments and according to techniques described herein, the magnitude of the current pulse provides an indicator of battery connectivity. In a specific embodiment the controller 24 sends an indicator when the magnitude of the current pulse reaches a pre-determined value to indicate battery dis-connectivity or discharged state.

Figure 2:
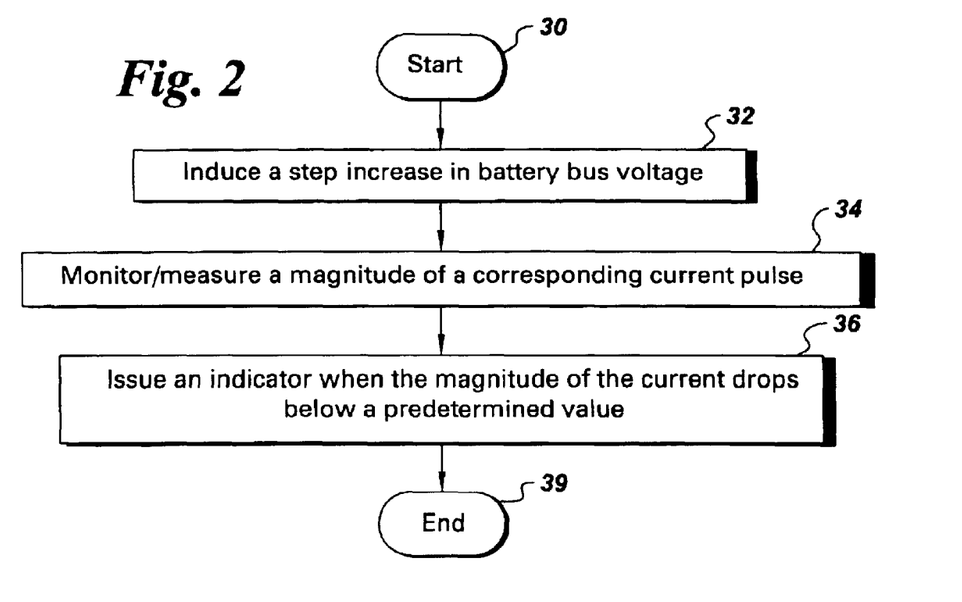
FIG. 2 is a flow diagram depicting a method for testing the battery connectivity in accordance with aspects of the present invention.

Aspects of the invention include a method for testing battery connectivity in a battery-backed up system as illustrated in the flowchart of FIG. 2. The method is initiated at 30 and comprises inducing a momentary step increase in a battery bus voltage at step 32 and monitoring a magnitude of a corresponding current pulse of a battery charge due to the step increase in the battery bus voltage at step 34. Battery under the floating condition draws very small charging current, a trickle charge. In this method, a small step increase in the battery bus voltage over and above the floating level is provided and the rise of the battery charging current is monitored. The step increase is less than about 10% of a float level of the battery bus voltage. 'Float level or float condition' as described herein means battery voltage when the battery is in full charged condition. Additionally, the step increase is applied momentarily, for less than about a two second duration. Thus, availability/presence of battery back up can be assured by detecting the corresponding step increase in current. The current rise is due to capacitive nature of the battery and mainly depends on factors like rate of rise of battery voltage, magnitude of the step change, battery impedance etc. 'Monitoring' as described herein includes measuring the magnitude of the current pulse and observing the current profile for any irregularities and degradation of the current rise over a period of time. The current pulse indicates the connectivity of the battery bank in the system. The method illustrated in FIG. 2 further comprises a step 36 for issuing an indicator when the magnitude of the current pulse drops below a pre-determined value and the method ends at 39. The indicator as described herein can be an alarm to a main control system or an auto-shutoff signal or a signal/message to any central or distributed maintenance system for further maintenance activity required on the battery.

Figure 3:
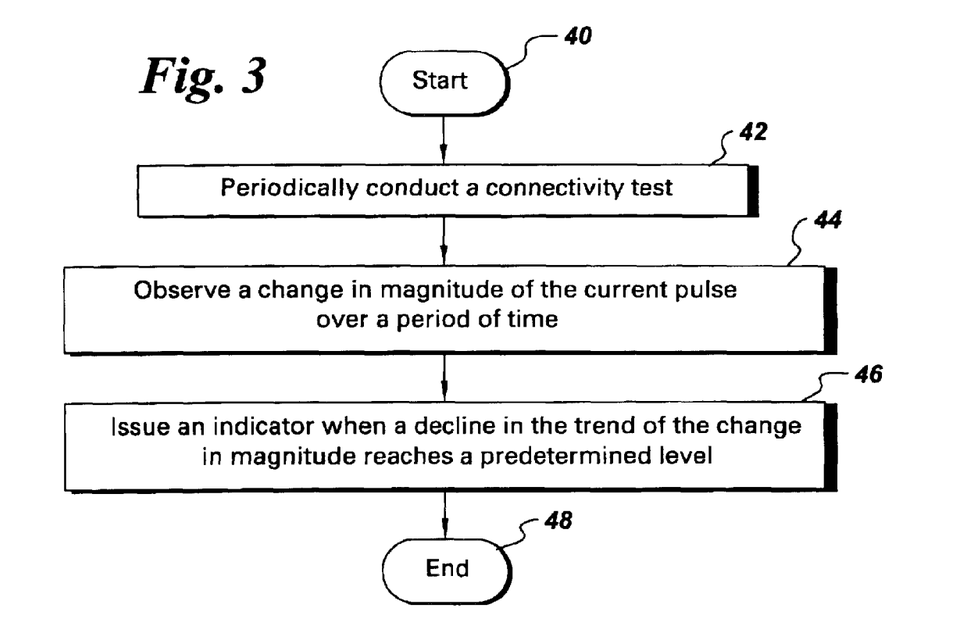
FIG. 3 is a flow diagram depicting a method for forecasting the battery health in accordance with aspects of present invention.

In another embodiment, a method as illustrated in FIG. 3 for forecasting a battery health by periodically testing battery connectivity and observing a trend of the current pulse over a period of time is provided. In this embodiment, a change in magnitude of the current pulse over the period of time is measured and provides an indicator for the battery health. Specifically, the method initiated at step 40 comprises periodically conducting a connectivity test at step 42, observing a magnitude of a current pulse obtained by the connectivity test over a period of time, and using a trend in change in magnitude of the current pulse over the period of time to indicate the battery health at step 44. The connectivity test is same as the method described in relation to FIG. 2. Referring to FIG. 3, the method further comprises issuing an indicator at step 46, when a decline in the trend of the change in magnitude of the current pulse reaches a predetermined value and the method terminates at 48.

As noted above, the flowcharts illustrated in FIG. 2 and FIG. 3 describe the aspects of the method discussed hereinabove. The foregoing flow charts also show the functionality and operation of the method and the system for testing battery connectivity and forecasting the battery health. In this regard, each block/component represents a module, segment, or portion of code, which comprises one or more executable instructions for implementing the specified logical functions. It should also be noted that in some alternative implementations, the functions noted in the blocks may occur out of the order noted in the figures or, for example, may in fact be executed substantially concurrently or in the reverse order, depending upon the functionality involved. Also, one of ordinary skill in the art will recognize that additional blocks may be added. Furthermore, the functions can be implemented in programming languages such as C++ or JAVA; however, other languages can be used.

The various embodiments and aspects of the invention described above comprise an ordered listing of executable instructions for implementing logical functions. The ordered listing can be embodied in any computer-readable medium for use by or in connection with a computer-based system that can retrieve the instructions and execute them. In the context of this application, the computer-readable medium can be any means that can contain, store, communicate, propagate, transmit or transport the instructions. The computer readable medium can be an electronic, a magnetic, an optical, an electromagnetic, or an infrared system, apparatus, or device. An illustrative, but non-exhaustive list of computer-readable mediums can include an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical).

Further, the computer readable medium may comprise paper or another suitable medium upon which the instructions are printed. For instance, the instructions can be electronically captured via optical scanning of the paper or other medium, then compiled, interpreted or otherwise processed in a suitable manner if necessary, and then stored in a computer memory.

Figure 4:
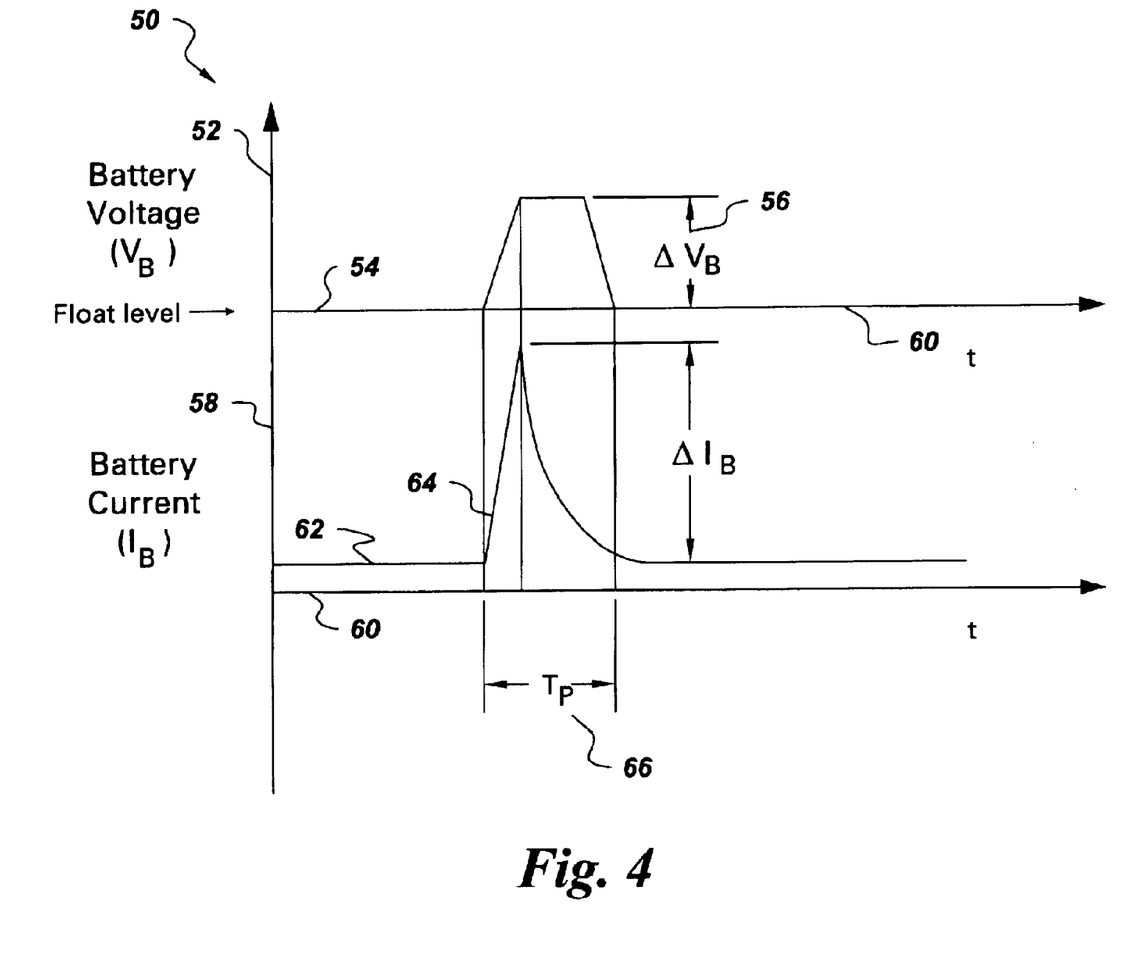
FIG. 4 is a graphical representation showing the profile of a current pulse due to step increase in the battery bus voltage in accordance with aspects of the present invention.

Referring now to FIG. 4, the graph 50 shows an expected battery current response 62 of a battery current 58 to a step change in the battery bus voltage 52 measured on a time axis 60. $\Delta VB$ is the voltage step pulse 56 in the battery bus voltage 52 over and above the float level 54. In response, $\Delta IB$ is the magnitude of the current pulse 64 in the current response 62. As is clear from the graphical representation, the duration (TP) 66 of the voltage step pulse 56 does not have substantial effect on the magnitude of the current pulse 64 in current response 62.

Figure 5:
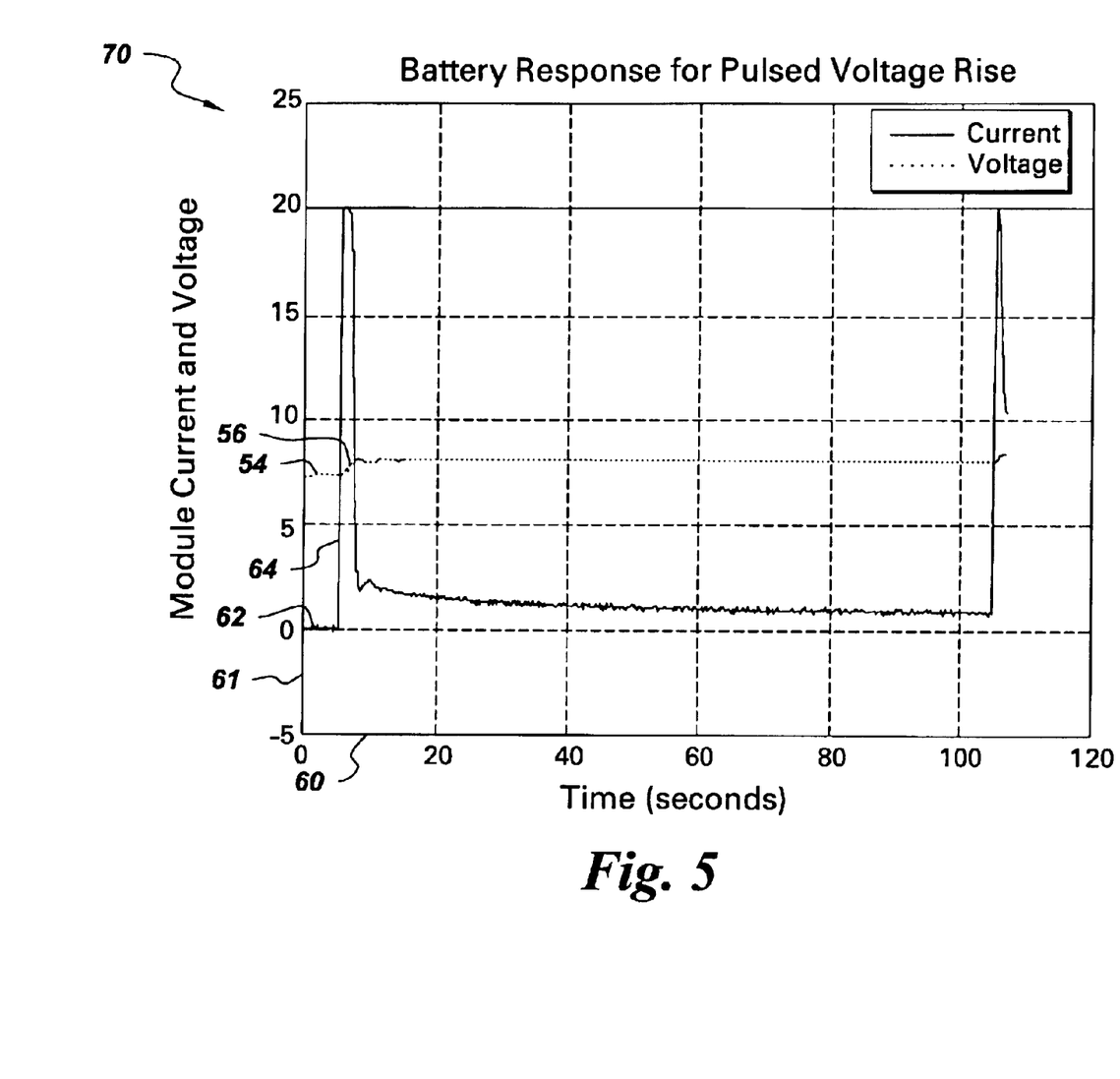
FIG. 5 is a graphical representation of the test results performed on Nickel Cadmium battery for a single module.
Figure 6:
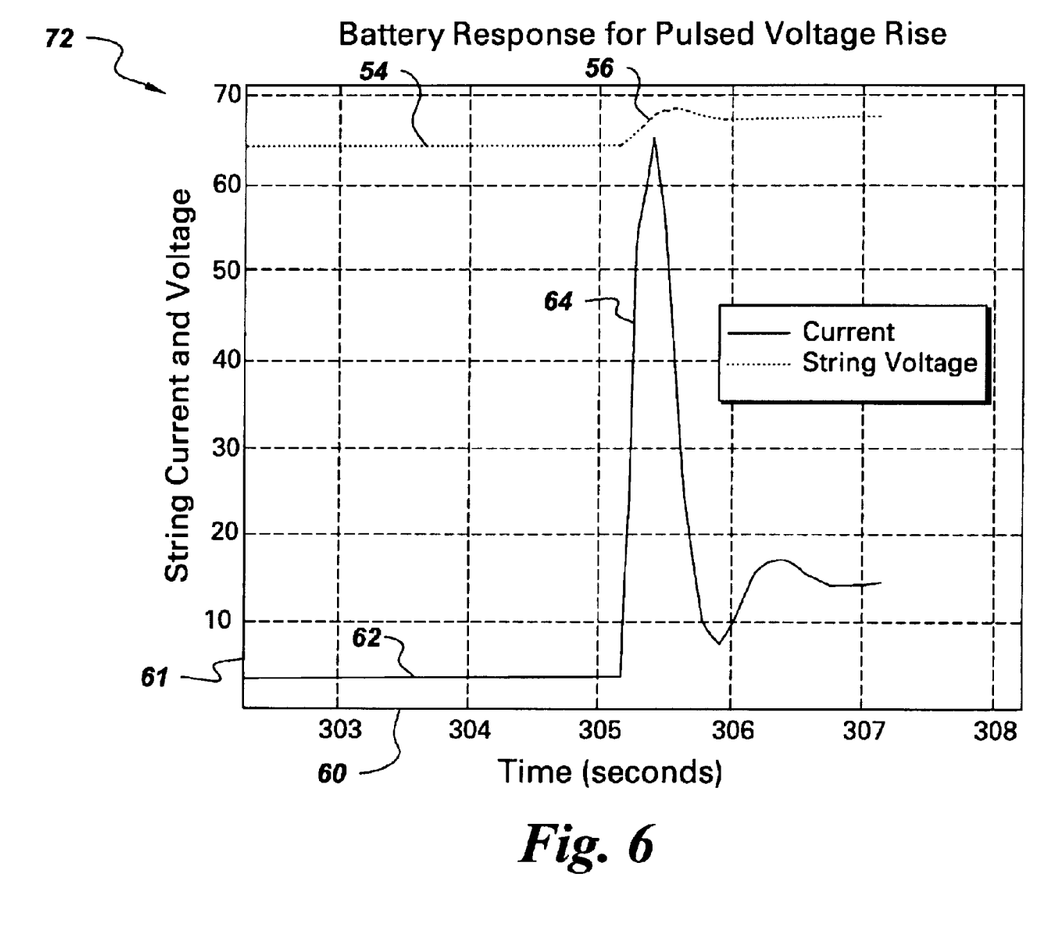
FIG. 6 is a graphical representation of the test results performed on Nickel Cadmium battery for a battery string.

FIG. 5 and FIG. 6 illustrate exemplary results in a graphical representation for the float level 54 of the battery bus voltage 52 and current response 62 using a Nickel Cadmium battery from SAFT (STM5–180) rated at 180 Ah, under two different cases, first a single module (one module comprises of five Ni—Cd cell) and second, a battery string (comprising of 8 modules). Current response 62 of the floating battery was monitored for a voltage pulse of duration 2 seconds and 5% magnitude. An Aero-Vironment ABC-150—programmable DC sink/source was used in these examples.

In reference to graph 70 in FIG. 5, which shows time on X-axis depicted by reference numeral 60, and amplitude (current and voltage) on Y-axis depicted by reference numeral 61, a Ni Cd module was allowed to float at 8 volts, shown by reference numeral 54, float level for the battery bus voltage. After that a step increase in the battery voltage to 8.5 volts was applied, depicted by reference numeral 56, for duration of 2 seconds, which resulted in the steep rise of the current pulse 64 in the current response 62, of about 20 A, as can be seen in the FIG. 5. In reference to graph 72 in FIG. 6, which shows time on X-axis depicted by reference numeral 60, and amplitude (current and voltage) on Y-axis depicted by reference numeral 61, a Ni—Cd battery string was allowed to float at 64 volts, again shown by reference numeral 54. After that a step increase in the battery voltage to 67.2 volts was applied, depicted by reference numeral 56, for duration of 2 seconds, which resulted in the steep change in the current pulse 64 in the current response 62, of about 65 A, as can be seen in the FIG. 6.

Figure 7:
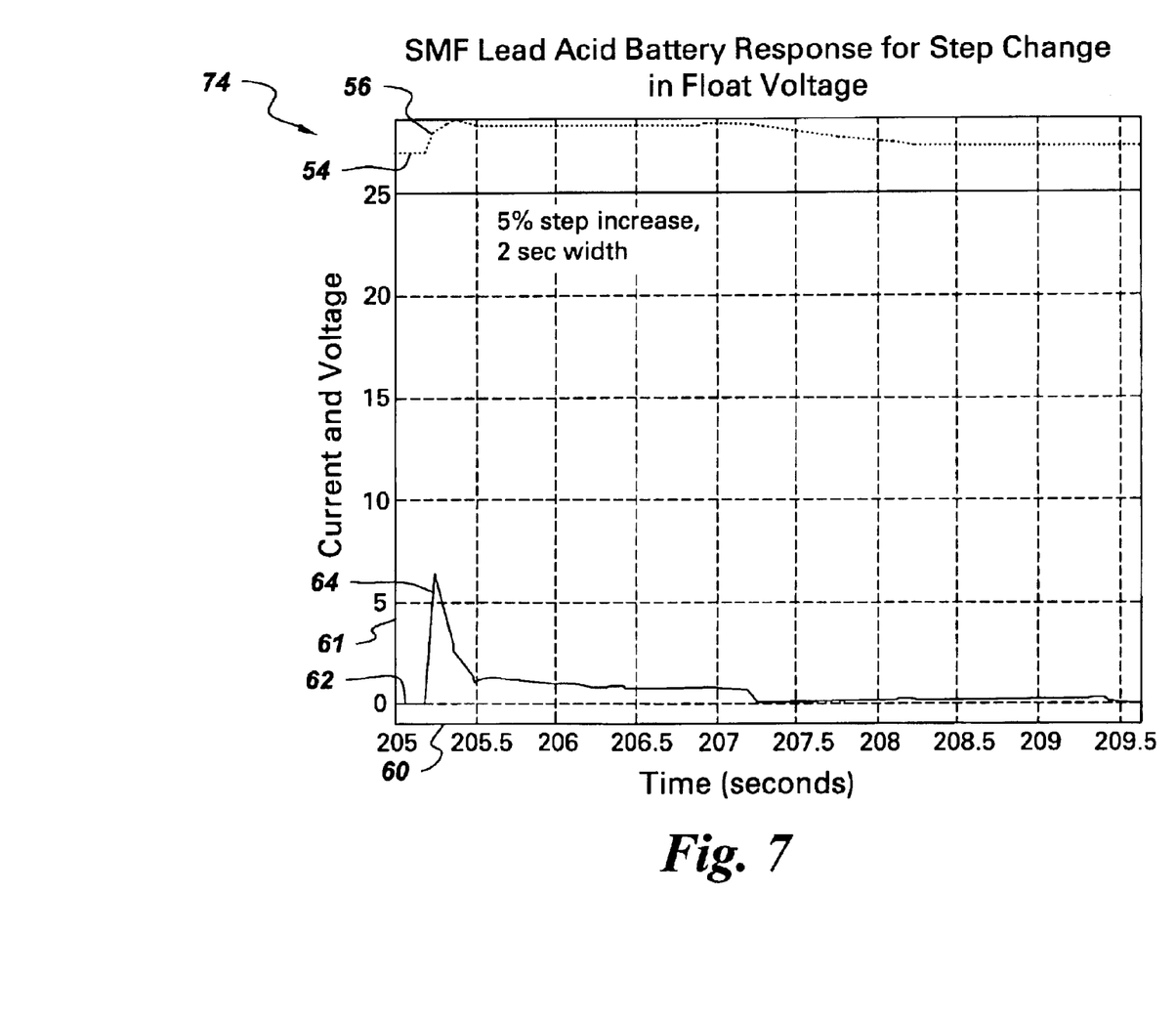
FIG. 7 is a graphical representation of the test results performed on Sealed Lead Acid battery for 5% step increase in bus voltage & 2 second pulse duration.
Figure 8:
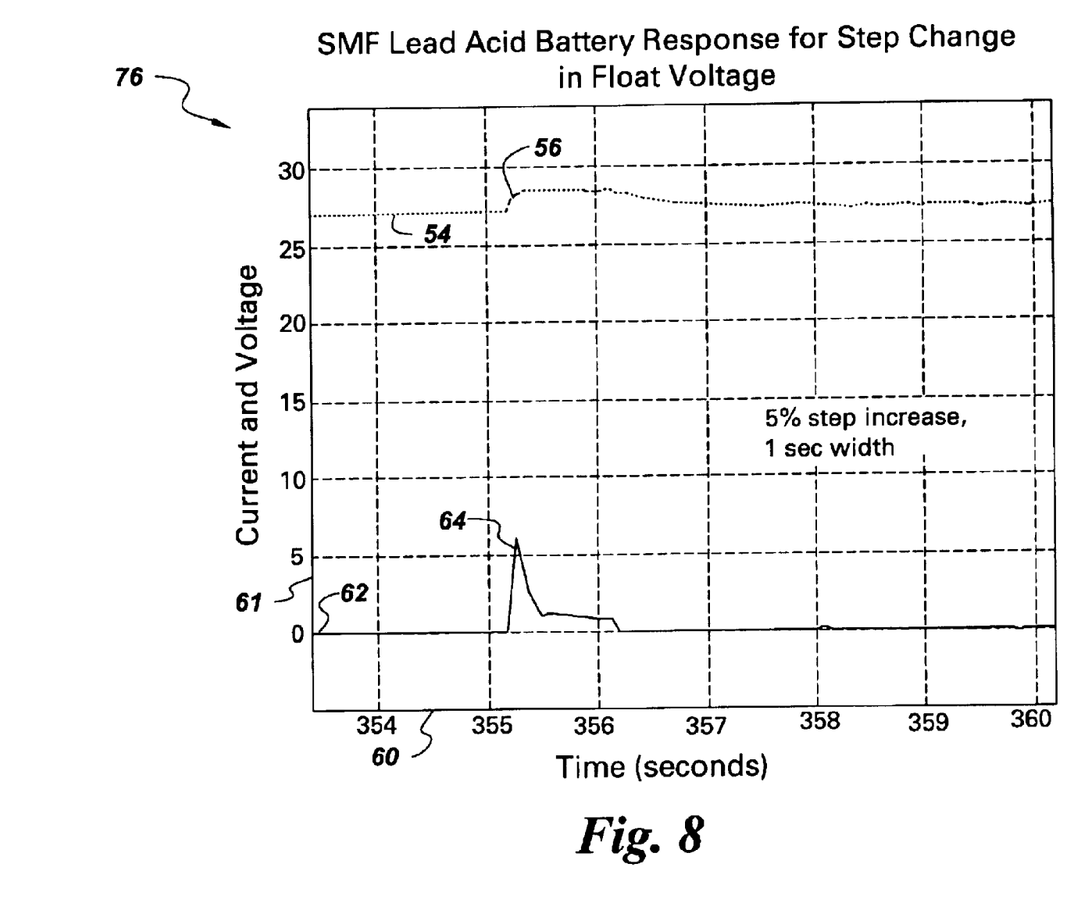
FIG. 8 is a graphical representation of the test results performed on Sealed Lead Acid battery for 5% step increase in bus voltage & 1 second pulse duration.
Figure 9:
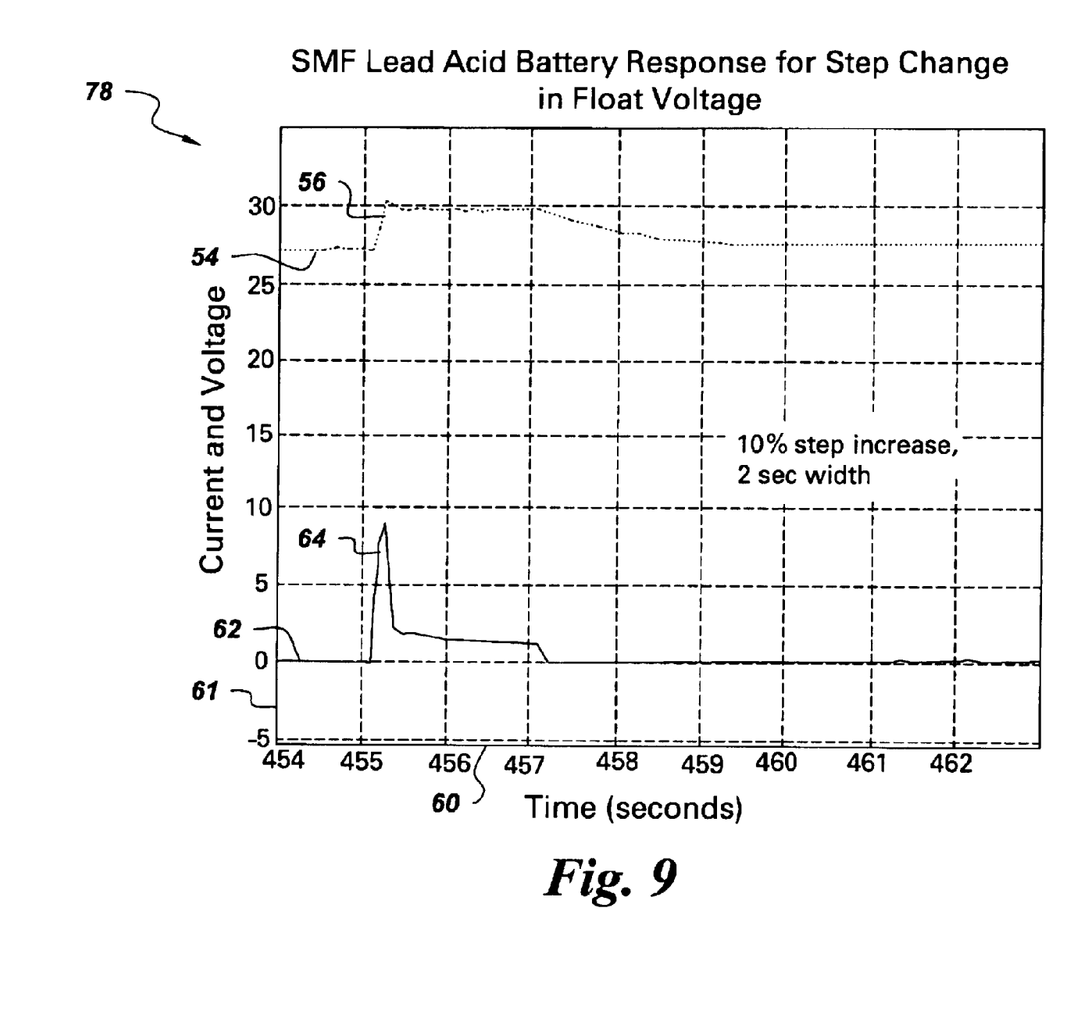
FIG. 9 is a graphical representation of the test results performed on Sealed Lead Acid battery for 10% step increase in bus voltage & 2 second pulse duration.

Further examples illustrating the current response 62 due the step rise in float level 54 of the battery bus voltage 52 are illustrated in FIG. 7, FIG. 8 and FIG. 9 using Sealed Lead Acid battery rated at 24 Volts & 12 Ah. In these examples, the battery response was monitored for three different cases as given below:

a) 5% step increase in bus voltage & 2 secs pulse duration.

b) 5% step increase in bus voltage & 1 secs pulse duration.

c) 10% step increase in bus voltage & 2 secs pulse duration.

In reference to graph 74 in FIG. 7, which shows time on X-axis depicted by reference numeral 60, and amplitude (current and voltage) on Y-axis depicted by reference numeral 61, the sealed Lead acid battery was allowed to float at 27 volts shown by reference numeral 54, float level for the battery bus voltage. After that a step increase in the battery voltage to 28.35 volts was applied, shown by reference numeral 56, for duration of 2 seconds, which resulted in the steep rise in the current pulse 64 in the charging current response 62 of about 6 A. In reference to graph 76 in FIG. 8, which shows time on X-axis depicted by reference numeral 60, and amplitude (current and voltage) on Y-axis depicted by reference numeral 61, the Sealed Lead acid battery was allowed to float at 27 volts, shown also by reference numeral 54, float level for the battery bus voltage. After that a step increase in the battery voltage to 28.35 volts was applied, shown by reference numeral 56, for duration of 1 seconds, which resulted in the steep rise in the current pulse 64 in the charging current response 62 of about 5.5 A. In reference to graph 78 in FIG. 9, which shows time on X-axis depicted by reference numeral 60, and amplitude (current and voltage) on Y-axis depicted by reference numeral 61, the Sealed Lead acid battery was allowed to float at 27 volts, shown again by reference numeral 54. After that a step increase in the battery voltage to 29.7 volts was applied, shown by reference numeral 56, for a duration of 2 seconds, which resulted in the steep rise in the current pulse 64 in the charging current response 62 of about 9 A. These results validate that ΔIB is proportional of magnitude of voltage pulse and that the duration of the voltage pulse has negligible effect on ΔIB.

Thus in reference to the description of various aspects of the technique described herein above, it would be appreciated by those skilled in the art that the current surge due to the step increase in battery bus voltage is quite substantial in magnitude and the current surge is detected easily. Also, the duration of the voltage pulse is for a short interval of time. Further, the increase in the battery bus voltage is easily achieved with minor modification in software embedded in converter 18. Existing current sensors as described earlier are utilized to sense the rise in battery current. Thus modifications required to implement aspects of this technique are minimal. The advantages include, that the test for assuring battery presence or connectivity can be carried out frequently without affecting battery life and system's capacity to support load in the event of mains failure. Applications for the aspects of present technique include all UPS, battery-backed-up supply systems and generally all systems using battery energy storage as a back-up.

While only certain features of the invention have been illustrated and described herein, many modifications and changes will occur to those skilled in the art. It is therefore to be understood that the appended claims are intended to cover all such modifications and changes as fall within the true spirit of the invention.

What is claimed is:

1. A method for testing battery connectivity in a battery-backed up system, the method comprising:
    inducing a step increase in a battery bus voltage; and
    monitoring a magnitude of a corresponding current pulse of a battery charge due to the step increase in the battery bus voltage,
    wherein the magnitude of the current pulse provides an indicator of battery connectivity.

2. The method of claim 1 further comprising issuing an indicator when the magnitude of the current pulse drops below a pre-determined value.

3. The method of claim 1, wherein the step increase is less than about 10% of a float level of the battery bus voltage.

4. The method of claim 1, wherein the step increase is applied for lees than about a two second duration.

5. The method of claim 1 further comprising forecasting a battery health by periodically testing battery connectivity and observing a trend of the current pulse over a period of time, wherein a change in magnitude of the current pulse over the period of time provides an indicator for the battery health.

6. A method for forecasting a battery health in a battery-backed up system, the method comprising:
    periodically conducting a connectivity test;
    observing a magnitude of a current pulse obtained by the connectivity test over a period of time; and
    using a trend in change in magnitude of the current pulse over the period of time to indicate the battery health,
    wherein the current pulse is a response to a step increase in a battery bus voltage.

7. The method of claim 6, wherein the connectivity test comprises:
    inducing the step increase in the battery bus voltage; and
    monitoring the magnitude of a corresponding current pulse of a battery charge due to the step increase in the battery bus voltage,
    wherein the magnitude of the current pulse provides an indicator of battery connectivity.

8. A method of claim 6 further comprising issuing an indicator when a decline in the trend of the change in magnitude of the current pulse reaches a predetermined value.

9. A battery-backed up system comprising:
    at least one battery to supply power to the system for maintaining a steady output;
    at least one converter for charging the battery; and
    a controller for detecting the battery connectivity,
    wherein the controller is configured for providing a step increase in a battery bus voltage and monitoring a magnitude of a corresponding current pulse of a battery charge.

10. The system of claim 9 further comprising a current sensor to detect the current pulse.

11. The system of claim 9, wherein the magnitude of the current pulse is an indicator of battery connectivity.

12. The system of claim 9 further comprising a plurality of batteries connected in series.

13. The system of claim 9 further comprising a plurality of converters, wherein at least one converter is coupled to an input of the system, and wherein at least one converter is coupled to an output of the system.

14. The system of claim 9, wherein the controller sends an indicator when the magnitude of the current pulse reaches a pre-determined value.

15. A computer readable medium for storing and/or transmitting instructions that, when executed by a computer, perform a method for detecting battery connectivity in a battery-backed up system, the method comprising:
    inducing a step increase in a battery bus voltage; and
    monitoring a magnitude of a corresponding current pulse of a battery charge due to the step increase in the battery bus voltage,
    wherein the magnitude of the current pulse provides an indicator of battery connectivity.

16. The computer readable medium of claim 15, wherein the method further comprises issuing an indicator when the magnitude of the current pulse drops below a pre-determined value.

17. A computer readable medium for storing and/or transmitting instructions that, when executed by a computer, perform a method for forecasting a battery health in a battery-backed up system, the method comprising:
    periodically conducting a connectivity test;
    observing a magnitude of a current pulse obtained by the connectivity test over a period of time; and
    using a trend in change in magnitude of the current pulse over a period of time to indicate the battery health,
    wherein the current pulse is in response to a step increase in a battery bus voltage.

18. The computer readable medium of claim 17, wherein the connectivity test comprises:
    inducing the step increase in a battery bus voltage; and
    monitoring the magnitude of a current pulse of a battery charge due to the step increase in the battery bus voltage,
    wherein the magnitude of the current pulse is an indicator of battery connectivity.

19. The computer readable medium of claim 17, wherein the method further comprises issuing an indicator when a decline in the trend in change or magnitude of the current pulse reaches a predetermined value.

* * * * *